(12) United States Patent
Kovac

(10) Patent No.: US 10,483,921 B2
(45) Date of Patent: Nov. 19, 2019

(54) CLOCKLESS FREQUENCY DETECTOR

(71) Applicant: pSemi Corporation, San Diego, CA (US)

(72) Inventor: David Kovac, Arlington Heights, IL (US)

(73) Assignee: pSemi Corporation, San Diego, CA (US)

( * ) Notice: Subject to any disclaimer, the term of this patent is extended or adjusted under 35 U.S.C. 154(b) by 323 days.

(21) Appl. No.: 15/607,374

(22) Filed: May 26, 2017

(65) Prior Publication Data

US 2018/0342986 A1 Nov. 29, 2018

(51) Int. Cl.
*H03F 1/30* (2006.01)
*H03F 3/20* (2006.01)

(52) U.S. Cl.
CPC .................. *H03F 1/30* (2013.01); *H03F 3/20* (2013.01); *H03F 2200/324* (2013.01); *H03F 2200/451* (2013.01)

(58) Field of Classification Search
CPC ........ H03F 1/30; H03F 3/20; H03F 2200/324; H03F 2200/451; H03J 3/00; H03J 7/22; H03J 2200/01
USPC ......................................................... 333/17.1
See application file for complete search history.

(56) References Cited

U.S. PATENT DOCUMENTS

| | | | |
|---|---|---|---|
| 7,248,120 B2 | 7/2007 | Burgener et al. | |
| 7,795,968 B1 | 9/2010 | Li et al. | |
| 8,487,706 B2 | 7/2013 | Li et al. | |
| 9,024,700 B2 | 5/2015 | Ranta | |
| 9,197,194 B2 | 11/2015 | Reedy et al. | |
| 9,276,526 B2 | 3/2016 | Nobbe et al. | |
| 9,294,056 B2 | 3/2016 | Nobbe et al. | |
| 9,595,923 B2 | 3/2017 | Nobbe et al. | |
| 9,602,063 B2 | 3/2017 | Kaatz et al. | |
| 9,647,631 B2 | 5/2017 | Gaynor | |
| 9,712,120 B2 | 7/2017 | Nobbe et al. | |
| 2008/0012648 A1* | 1/2008 | Wu ........................ | H03C 3/225 331/16 |

(Continued)

OTHER PUBLICATIONS

Federal Communications Commission (FCC) defines radio frequency (RF) ranging from 9 kHz to 3000 GHz, "Equipment Authorization—RF Device"—what is an RF device, https://www.fcc.gov/oet/ea/rfdevice . According to Internet way back machine data first publicly visited on Mar. 2016 (Year: 2016).*

(Continued)

*Primary Examiner* — Benny T Lee
*Assistant Examiner* — Hafizur Rahman
(74) *Attorney, Agent, or Firm* — Jaquez Land Greenhaus LLP; Alessandro Steinfl, Esq.

(57) ABSTRACT

Devices and methods for tuning a tunable circuit based on a frequency of operation of the tunable circuit using a clockless frequency detector circuit are described. The clockless frequency detector uses a filter having a slope in its frequency response curve that includes a frequency range of operation of the tunable circuit. Frequency-based attenuation through the filter of an RF signal provided to the tunable circuit is used to provide an indication of the frequency of operation. The tunable circuit, including the clockless frequency detector, can be integrated within a same chip that is autonomously configurable based on the frequency of operation.

19 Claims, 9 Drawing Sheets

(56) References Cited

U.S. PATENT DOCUMENTS

| | | | |
|---|---|---|---|
| 2014/0179249 A1* | 6/2014 | Burgener | H01Q 23/00 455/127.1 |
| 2015/0236748 A1 | 8/2015 | Nobbe | |
| 2015/0236798 A1 | 8/2015 | Nobbe | |
| 2015/0249479 A1 | 9/2015 | Nobbe | |

OTHER PUBLICATIONS

"Passive Low Pass Filter", Electronics Tutorials, AspenCore, Inc., According to Internet way back machine data first publicly visited on Nov. 2007 (Year: 2007).*

PLL Loop Filter of the PLL tutorial of electronic notes. This tutorial was first publicly visited on Feb. 2017 (Year: 2017).*

Mouser electronics application note, entitled: "RF Wireless Technology", p. 1, lines 14-16, according Internet Way back machine first publicly visited on Oct. 20, 2012. (Year: 2012).*

* cited by examiner

CLOCKLESS FREQUENCY DETECTOR

CROSS-REFERENCE TO RELATED APPLICATIONS

Cross-Reference to Related Tunable Circuits Applications

The present application may be related to U.S. Pat. No. 9,595,923, entitled "Systems and Methods for Optimizing Amplifier Operations", issued Mar. 14, 2017, the disclosure of which is incorporated herein by reference in its entirety; the present application may also be related to co-pending U.S. patent application Ser. No. 14/794,699, entitled "Systems and Methods for Optimizing Amplifier Operations", filed on Jul. 8, 2015, which is issued as U.S. Pat. No. 9,712,120 on 18 Jul. 2017, the disclosure of which is incorporated herein by reference in its entirety; the present application may also be related to U.S. Pat. No. 9,294,056 entitled "Scalable Periphery Tunable Matching Power Amplifier", issued Mar. 22, 2016, the disclosure of which is incorporated herein by reference in its entirety; the present application may also be related to U.S. Pat. No. 9,602,063 entitled "Variable Impedance Match and Variable Harmonic Terminations for Different Modes and Frequency Bands", issued Mar. 21, 2017, the disclosure of which is incorporated herein by reference in its entirety; the present application may also be related to U.S. Pat. No. 9,647,631 entitled "Tunable Impedance Matching Network", issued May 9, 2017, the disclosure of which is incorporated herein by reference in its entirety; the present application may also be related to U.S. Pat. No. 9,276,526 entitled "Amplifier with Variable Feedback Impedance", issued Mar. 1, 2016, the disclosure of which is incorporated herein by reference in its entirety; the present application may also be related to Published US Application No. 2015/0236748 A1 entitled "Devices and Methods for Duplexer Loss Reduction", published Aug. 20, 2015, the disclosure of which is incorporated herein by reference in its entirety; the present application may also be related to Published US Application No. 2015/0249479 A1 entitled "RF Switch with Integrated Tuning", published Sep. 3, 2015, the disclosure of which is incorporated herein by reference in its entirety; the present application may also be related to Published US Application No. 2015/0236798 A1, published Aug. 20, 2015, entitled "Methods for Increasing RF Throughout via usage of Tunable Filters", the disclosure of which is incorporated herein by reference in its entirety; the present application may also be related to U.S. Pat. No. 7,795,968, entitled "Power Ranging Transmit RF Power Amplifier", issued on Sep. 14, 2010, the disclosure of which is incorporated herein by reference in its entirety; the present application may also be related to U.S. Pat. No. 7,248,120, issued on Jul. 24, 2007, entitled "Stacked Transistor Method and Apparatus", the disclosure of which is incorporated herein by reference in its entirety; the present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety.

Cross-Reference to Related Tunable Elements Applications

The present application may also be related to U.S. Pat. No. 9,024,700 B2 entitled "Method and Apparatus for use in Digitally Tuning a Capacitor in an Integrated Circuit Device", issued May 5, 2015, the disclosure of which is incorporated herein by reference in its entirety; and the present application may also be related to No. U.S. Pat. No. 9,197,194 B2 entitled "Method and Apparatus for Use in Tuning Reactance in an Integrated Circuit Device", issued Nov. 24, 2015, the disclosure of which is incorporated herein by reference in its entirety.

TECHNICAL FIELD

The present application relates to methods and devices for tuning radio frequency (RF) circuits based on frequencies of operation of the circuits via a clockless frequency detector.

BACKGROUND

Tunable elements of an RF circuit can allow tuning a circuit based on specific frequencies of operation of the circuit which can change, for example, in dependence of a mode of operation of the circuit. Such tuning can allow, for example, tuning of RF frontend blocks used in RF communication systems, such as handheld and portable devices, for optimization of their performance over a wide range of frequencies. Tunable circuits used in such RF frontend blocks may include, for example, one or more of power amplifiers (PA's), low noise amplifiers (LNA's), antenna tuners, filters, couplers, mixers and other, as descried, for example, in the above referenced Tunable Circuits, the disclosures of which are incorporated herein by reference in their entirety. Tunable elements of such tuning circuits may include circuits and/or components whose characteristics can be controlled, via either analog or digital control signals. Exemplary tunable elements include digitally tunable capacitors and/or inductors (DTCs, DTLs) as described in the above referenced U.S. Pat. No. 9,024,700 B2 and U.S. Pat. No. 9,197,194 B2, where capacitance and inductance may be controlled via digital control signals. When used in a tunable circuit, DTCs and/or DTLs can change, for example, a frequency response of the circuit based on the provided digital control signals.

In cases where the tunable circuit is monolithically integrated as an integrated circuit (IC), a system integrator using such IC may need to include auxiliary support blocks (firmware/software/hardware) that generate and feed to the IC, frequency based control signals for each tunable element of the IC in order to tune the tunable circuit. In other words, tuning of the tunable circuit may require, for example, detecting a change in an effective operating frequency of the tunable circuit, measuring the effective operating frequency, based on the measured frequency, generating control signals for each of the tunable elements of the tunable circuit, and send the generated control signals to the tunable circuit. Such auxiliary support blocks may add to system complexity, cost, and physical size, which together, may render usage of such tunable IC less desirable to some system integrators.

SUMMARY

The teachings according to the present disclosure describe devices and methods for on-chip detection of a frequency of operation of a tunable circuit via a clockless frequency detector circuit. In turn, the detected frequency can be used to automatically program tunable elements of the tunable circuit without intervention of, and/or requirement for, auxiliary (external) support blocks. Accordingly, a tunable circuit using the clockless frequency detector according to the present disclosure can be used as a drop-in replacement part to a non-tunable circuit.

The details of one or more embodiments according to the present disclosure are set forth in the accompanying drawings and the description below. Other features, objects, and advantages of such embodiments will be apparent from the description and drawings, and from the claims.

According to a first aspect of the present disclosure, a radio frequency (RF) tunable circuit configured to operate over a frequency range of operation of an input RF signal is presented, the RF tunable circuit comprising: one or more tunable elements; a filter having at least one frequency response slope in a frequency region that covers the frequency range of operation of the tunable circuit, the at least one frequency response slope determined by one or more poles used to realize the filter; a level detector coupled to the filter, and configured to detect an amplitude of the input RF signal through the filter; wherein tuning of the one or more tunable elements is based on a detected amplitude of the input RF signal through the filter, and is configured to provide a tuned frequency dependent performance of an output RF signal of the tunable circuit.

According to a second aspect of the present disclosure, a method for tuning a radio frequency (RF) tunable circuit is presented, the method comprising: providing one or more tunable elements of the tunable circuit; providing a frequency range of operation of an input RF signal to the tunable circuit; realizing a filter having at least one frequency response slope in a frequency region that covers the frequency range of operation of the tunable circuit, the at least one frequency response slope determined by one or more poles used to realize the filter; feeding an input RF signal operating at a first frequency of the frequency range to the tunable circuit and the filter; based on the feeding, detecting via a level detector coupled to the filter, an amplitude of the input RF signal through the filter; based on the detecting, tuning of the one or more tunable elements; and based on the tuning, providing a tuned frequency dependent performance of an output RF signal of the tunable circuit based on the first frequency.

DESCRIPTION OF THE DRAWINGS

Like reference numbers and designations in the various drawings indicate like elements.

DETAILED DESCRIPTION

Figure 1:
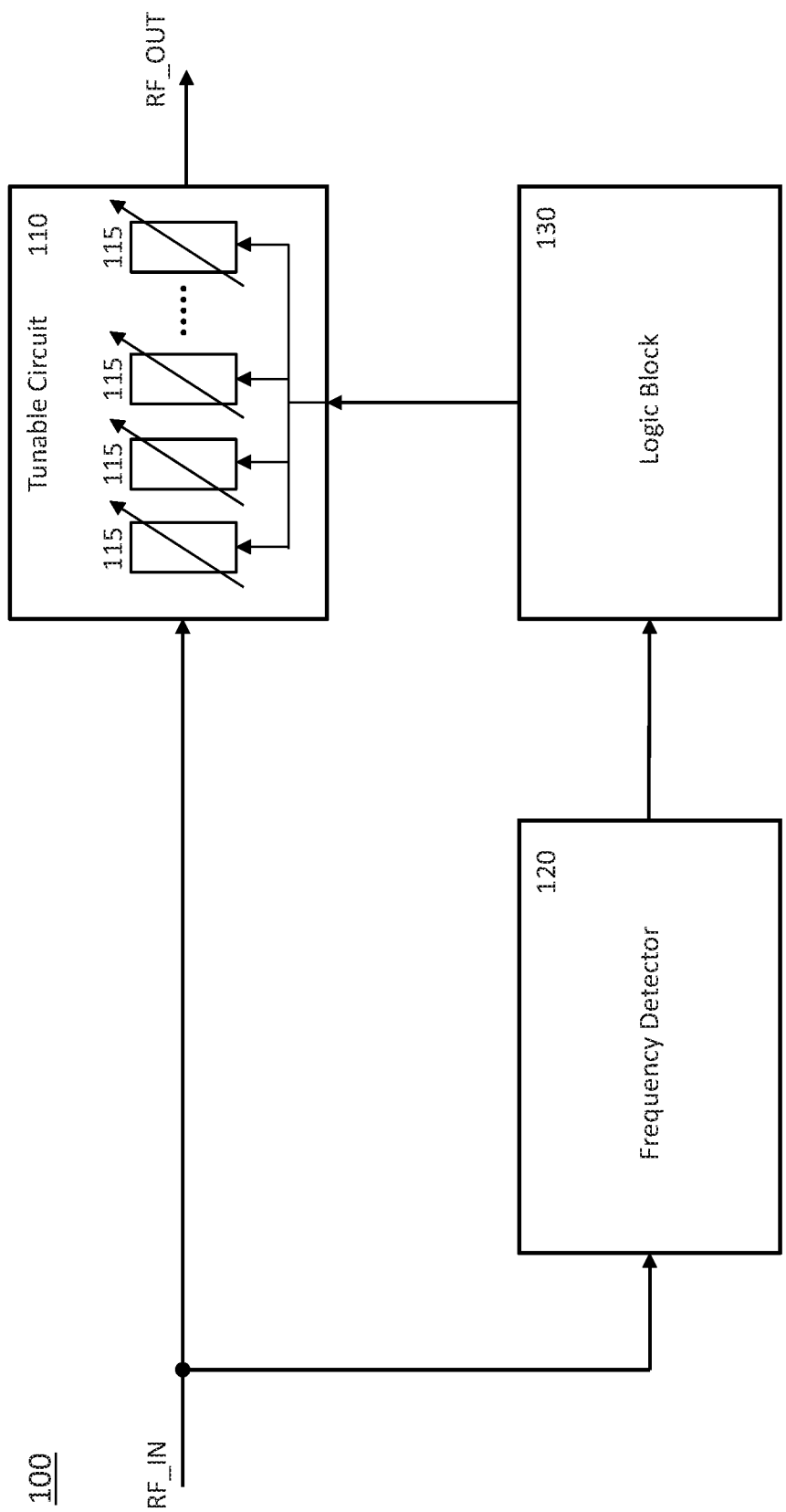
FIG. 1 shows a block diagram of an RF system (100) comprising a tunable circuit (110) whose performance can be tuned based on a frequency of an input RF signal to the tunable circuit via a clockless frequency detector circuit (120) according to various embodiments of the present disclosure. The RF system (100) may be monolithically integrated on a single chip.

FIG. 1 shows a block diagram of an exemplary embodiment according to the present disclosure of a system (100), comprising a tunable circuit (110), a frequency detector circuit (120), and a logic circuit (130). The system (100) may be monolithically integrated on a single chip.

The tunable circuit (110) is configured to receive an input signal, RF_IN, at an input port of the tunable circuit (110), and generate therefrom, an output signal, RF_OUT, at an output port of the tunable circuit (110), by impressing desired characteristics upon the output signal, RF_OUT, that are based on tuned characteristics of tunable elements (115) of the tunable circuit (110). The frequency detector circuit (120) also receives the RF_IN signal, detects a frequency of the RF_IN signal, and provides an indication (e.g. unique identifier) of the detected frequency to the logic circuit (130). The logic circuit (130) uses information received from the frequency detector circuit (120) to generate control signals that are provided to the tunable circuit (110) for tuning of the tunable elements (115) of the tunable circuit (110), and thereby, impressing the desired characteristics upon the output signal, RF_OUT. According to some exemplary embodiments, the logic circuit (130) may use simple logic gates and/or a lookup table to generate the control signals for tuning of the tunable elements (115) of the tuning circuit (110). An analog-to-digital (A/D) converter may be optionally be used in the logic circuit to convert analog information received from the frequency detector circuit (120) to a digital representation.

A person skilled in the art is well aware of known implementation practices that use phase-locked loops (PLL's) to detect a frequency of a signal by (phase) locking to a clock of a known frequency. In such implementations, a reference oscillator (e.g. crystal oscillator) of a known frequency is provided, from which the clock of known frequency is derived, via, for example, counters. In other implementations, frequency detection may be provided by using counters or dividers and without a PLL. For example, one could count or divide on every RF cycle and then use the number of RF cycles per a reference clock cycle to get an indication of the input frequency. There are many ways to use counters and/or dividers for frequency detection applications, but all involve a reference clock. By virtue of its bulkiness, such reference clock may not be suitable for monolithic integration with the system (100) of FIG. 1, and therefore may be provided as an external auxiliary support block to the system (100). Furthermore, a person skilled in the art is well aware of undesired effects of providing a reference clock, as such reference clock may generate spurious clock components whose frequencies may interact with operating frequencies of the tunable circuit (110). Therefore, a person skilled in the art would appreciate that the frequency detector circuit (120) according to the present disclosure does not use a (reference) clock to detect a frequency of operation of the RF_IN signal. Accordingly, the clockless system (100) according to the present disclosure can be monolithically integrated and operate in an autonomous manner, where, for example, tuning can be automatically performed as an internal function of the system (100).

Figure 2:
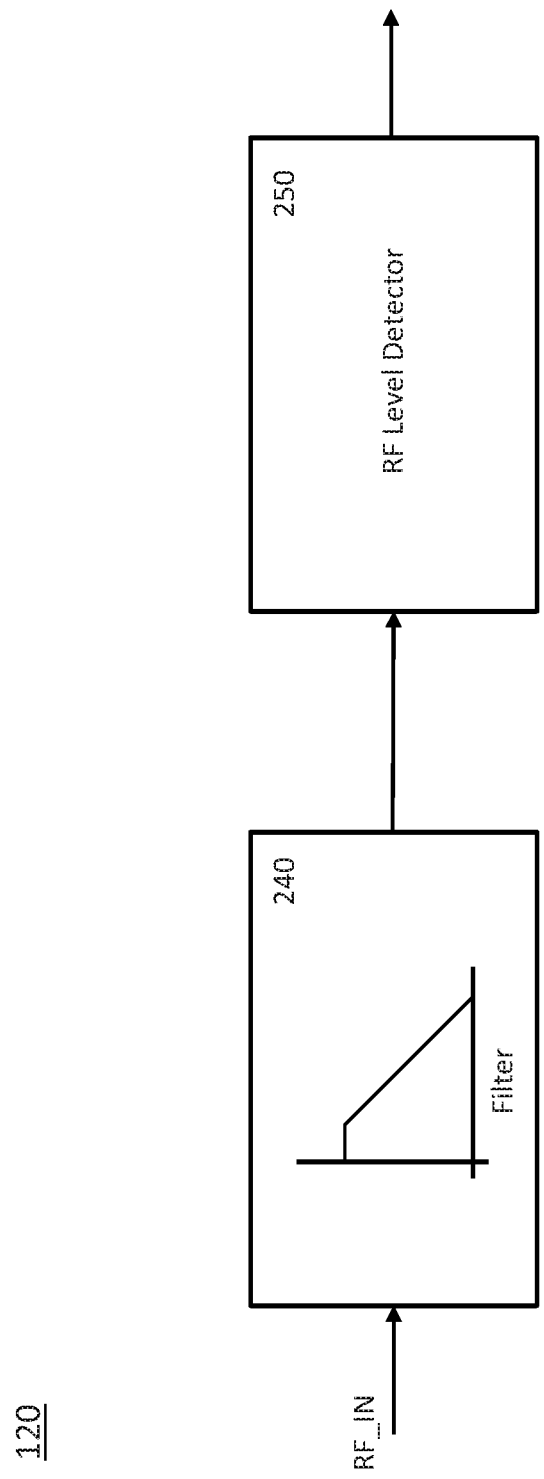
FIG. 2 shows a simplified block diagram of the clockless frequency detector circuit (120) according to the present disclosure, comprising a filter and an RF level detector.
Figure 3:
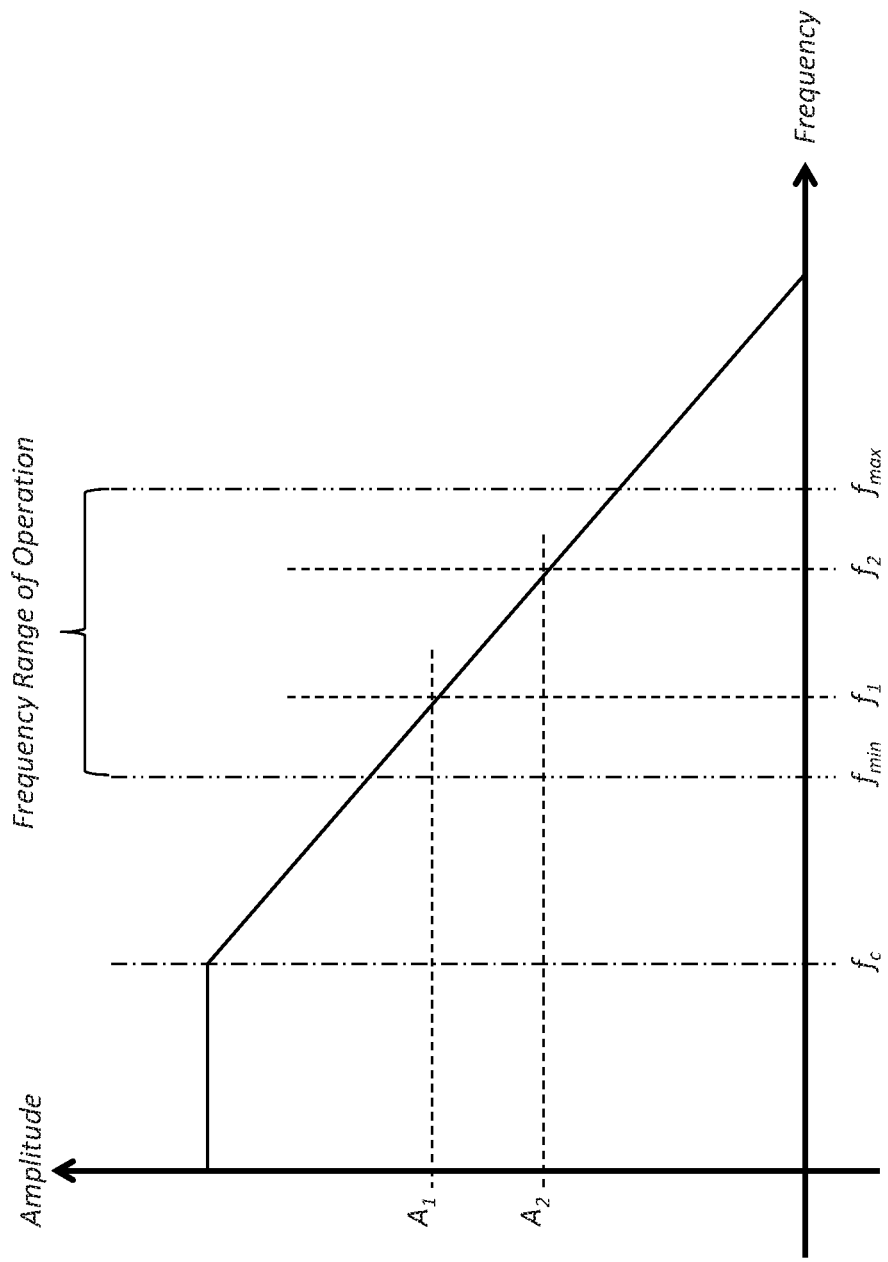
FIG. 3 shows an exemplary transfer function of the filter depicted in FIG. 2. A slope region of the transfer function may be based on a frequency range of operation on the RF system (100).

FIG. 2 shows a simplified circuit diagram of the clockless frequency detector circuit (120), according to an exemplary embodiment of the present disclosure. As can be seen in FIG. 2, the frequency detector circuit (120) comprises a filter (240), e.g. a low pass filter, and an RF level detector circuit (250). A corner frequency, $f_c$, of the low pass filter (240) maybe provided based on a frequency range of operation, $[f_{min}, f_{max}]$, of the RF_IN signal, such that any frequency within such range of operation falls within a sloped region of the low pass filter (240) and sufficiently away from the $f_c$ frequency. This allows the low pass filter (240) to map any two different frequencies, $(f_1, f_2)$, within the frequency range of operation, $[f_{min}, f_{max}]$, to two different amplitude levels, $(A_1, A_2)$, as depicted in an exemplary filter (240) transfer function (340) depicted in FIG. 3. In turn, for an RF_IN signal of constant amplitude fed to the low pass filter (240), a detected amplitude level by the RF level detector circuit (250) corresponds to a unique frequency of operation of the RF_IN signal. It should be noted that the exemplary embodiment of a low pass filter as shown in FIG. 2 should not be considered as limiting the scope of the present teachings, as any other type of filter (e.g. high pass, band pass, band reject, notch, etc.) having a slope region through the frequency range of operation can also be used.

With continued reference to FIG. 2, it should be noted that a frequency detection resolution of the frequency detector circuit (120) may be based on the slope of the low pass filter (240) that is determined by a number of poles used to realize such filter. A person skilled in the art readily knows that a higher number of poles may provide a steeper slope and thereby a higher detection resolution. In general, and as known by a person skilled in the art, each pole of the filter may introduce a slope of −20 dB per decade. Alternatively, an amplification stage may be included at the output of the low pass filter (240) to amplify a filtered signal and thereby increasing the detection resolution. A detection resolution of the frequency detector circuit of FIG. 2 may be based on desired tuning performance of the tunable circuit (110). For example, in one case, tuning may be solely based on a frequency band of operation of the tunable circuit (110), and in another case, tuning may be further based on a deviation of a frequency of operation within a given frequency band of operation, and therefore require a higher frequency detection resolution.

Figure 4:
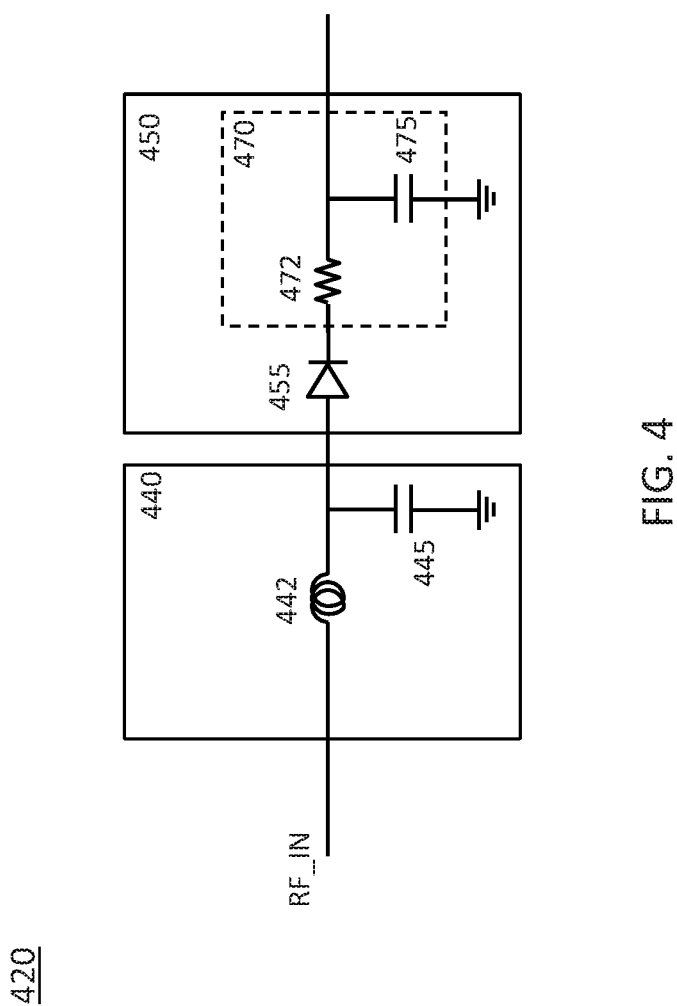
FIG. 4 shows an exemplary circuit representation of the clockless frequency detector according to the present disclosure.

As noted above, frequency detection may be provided based on a constant amplitude RF signal. However, as known to a person skilled in the art, amplitude of an RF signal may include an amplitude modulation component that is based on an RF modulation scheme of a corresponding air interface. In order to remove effects of such amplitude modulation component on a frequency detection performance/accuracy of the frequency detector circuit according to the present teachings, a base band (low pass) filter may be used as part of the RF level detection, as depicted in FIG. 4 (element 470). By filtering out the amplitude modulation component of the RF_IN signal, a constant amplitude RF level is obtained.

FIG. 4 shows further details of one exemplary embodiment (420) according to the present disclosure of the clockless frequency detector circuit (120), where the low pass filter (240) is a simple single-pole, second order, filter (440), represented by an inductor (442) and a capacitor (445), and where RF level detection (450) is provided via a simple rectifier circuit using a diode (455). As noted above, the low pass filter (440) may have different number of poles (and therefore different orders) that in some cases may be according to a desired frequency detection resolution. Furthermore, as noted above, a base band filter (470) can be used to remove an amplitude modulation component of the RF_IN signal. According to an exemplary embodiment, such base band filter (470) may comprise a resistor (472) and a capacitor (475) that operate as a single pole low pass filter with a corner frequency lower than a frequency of the amplitude modulation component of the RF_IN signal.

Figure 5:
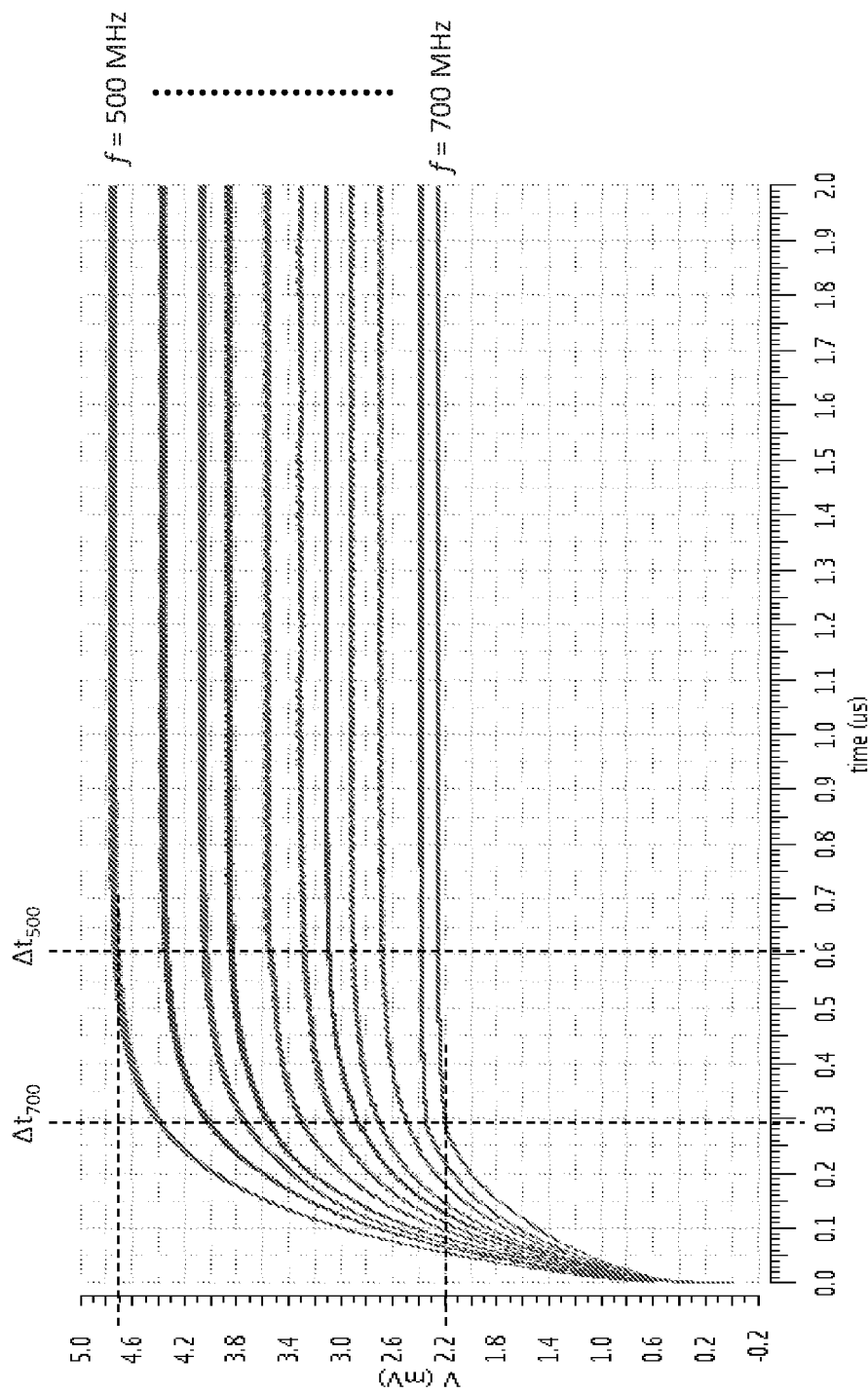
FIG. 5 shows graphs representing transient simulation results of the clockless frequency detector circuit according to the present disclosure. Each graph represents a transient amplitude response and corresponding settling time for a different frequency of a constant amplitude input RF signal.
Figure 6:
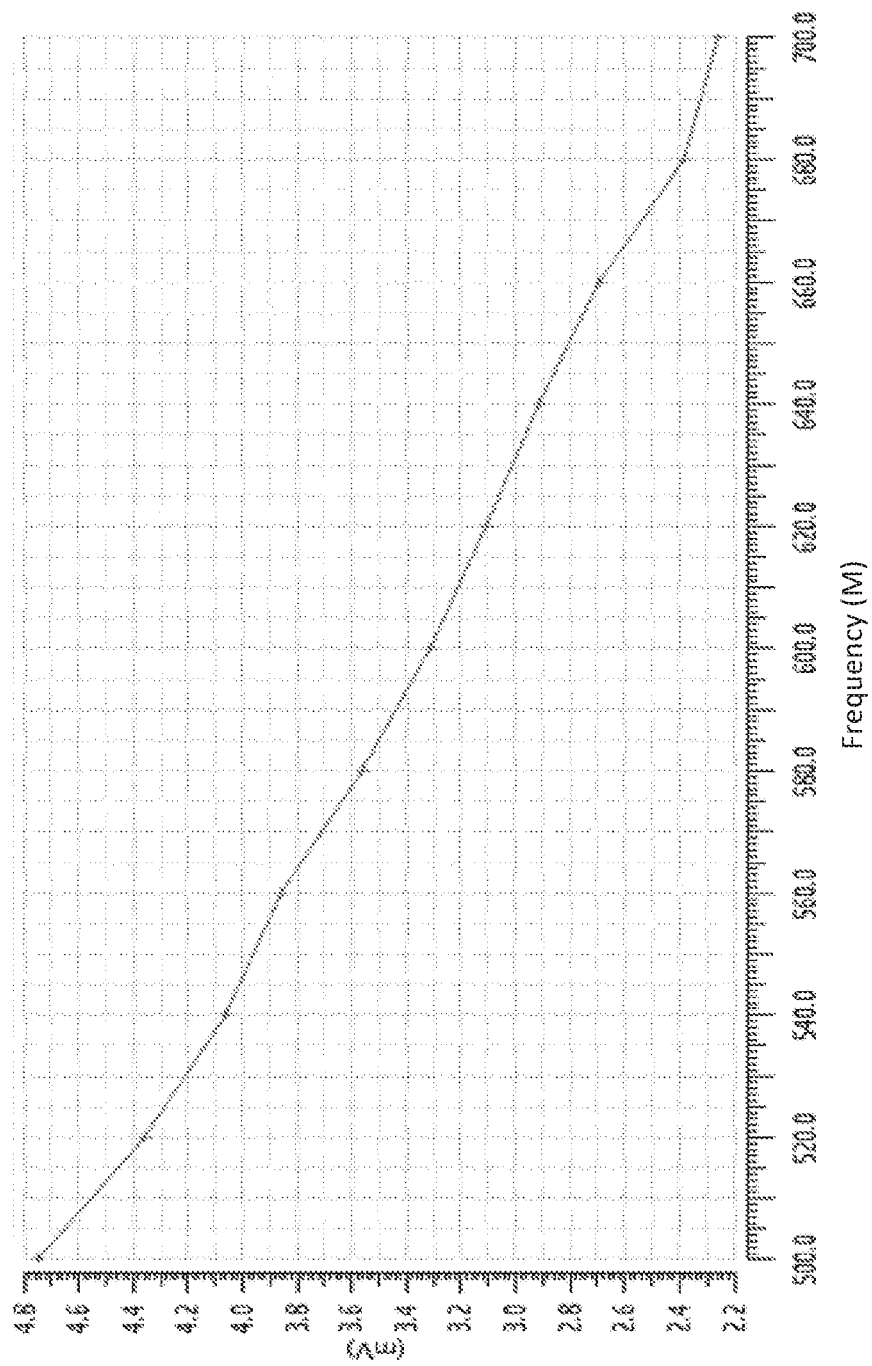
FIG. 6 shows a graph representing a voltage output the clockless frequency detector as a function of a frequency of an input RF signal to the clockless frequency detector.

FIG. 5 shows exemplary graphs representing transient simulation results of the clockless frequency detector circuit (420) provided in FIG. 4. Each graph shows a transient amplitude response, as provided at the output of the base band filter (470), for a constant amplitude RF_IN signal of a given frequency between 500 MHz and 700 MHz. As can be seen in FIG. 5, the transient amplitude response has a settling time, $\Delta t_f$, that is an increasing function of the output amplitude, and in the order of 0.3-0.6 μs. Also, as can be seen in FIG. 5, settled output amplitude varies from about 2.2 mV to about 4.7 mV when the frequency varies from 700 MHz to 500 MHz. Such transient response graphs were obtained using a second order low pass filter (440) having a single pole (e.g. LC filter 440). As noted above, further resolution may be provided by increasing number of poles of the low pass filter (440) or by amplifying the filtered signal at the output of the low pass filter (440), via for example, the buffer/amplifier (557), thereby providing a larger difference between the lowest and the highest settled output amplitudes shown in the graphs of FIG. 5. By varying the frequency of the RF_IN signal and sampling the detected RF level after a 1 μs (e.g. beyond settling times of FIG. 5) of the varying, the curve depicted in FIG. 6 is obtained. This curve shows a substantially linear relationship of the detected RF level at the output of the clockless frequency detector (420) according to the present teachings with respect to the operating frequency of the RF_IN signal.

Figure 7:
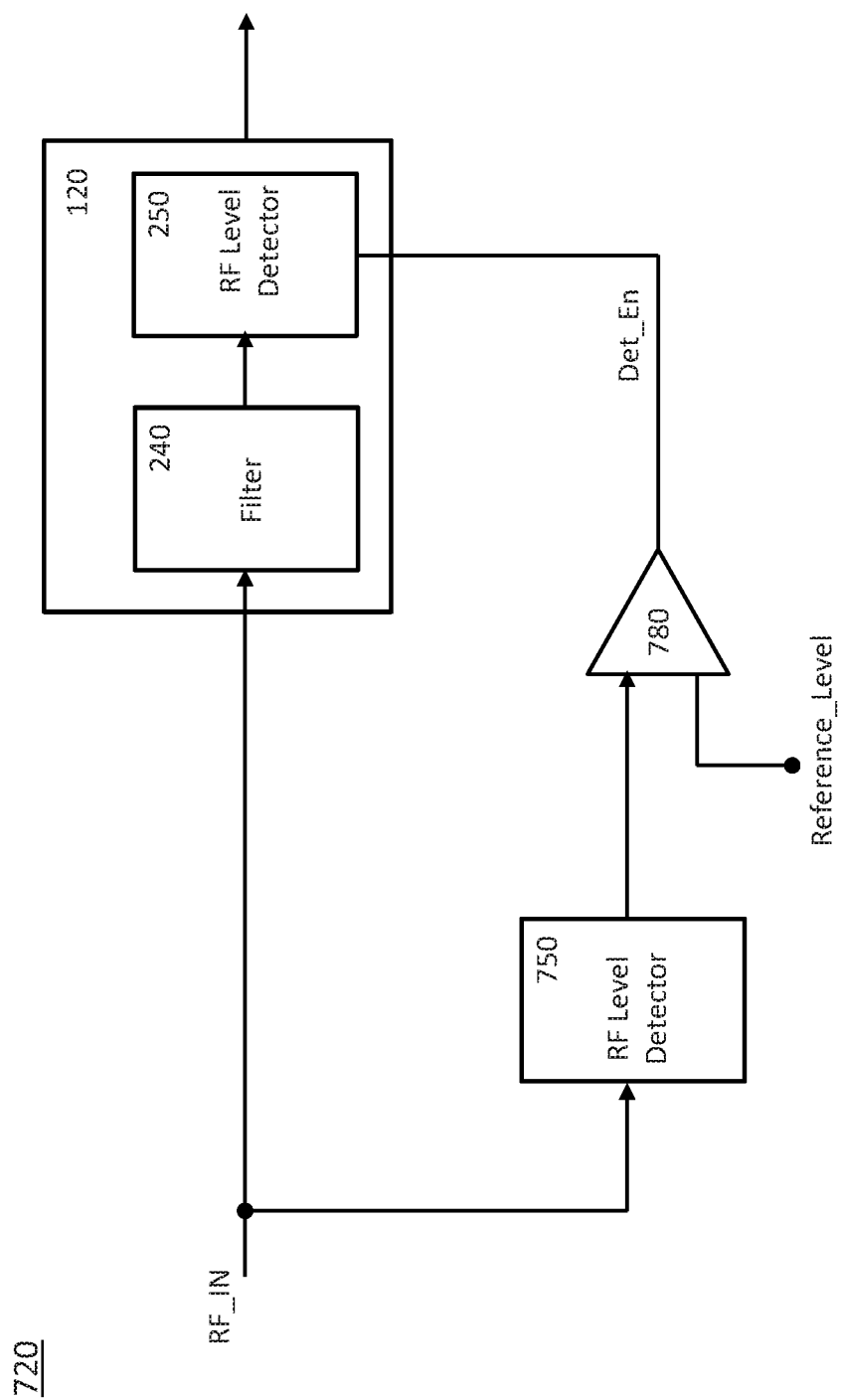
FIG. 7 shows a simplified block diagram of a clockless frequency detector, according to an embodiment of the present disclosure, based on the embodiment depicted in FIG. 2. In the embodiment depicted in FIG. 7, an additional RF level detector coupled to a comparator is used to verify an amplitude level of the input RF signal prior to enabling frequency detection via the clockless frequency detector.

FIG. 7 shows further implementation details of the clockless frequency detector, 720 according to the present disclosure, where frequency detection may be triggered based on a detected amplitude of the RF_IN signal. As can be seen in FIG. 7, and additional RF level detector circuit (750), coupled to the input RF_IN signal, is used to detect an amplitude level of the input RF_IN signal which is subsequently compared, via comparator (780), to a reference amplitude level. If the amplitude level detected via the additional RF level detector circuit (750) is larger than the reference amplitude level, then the comparator (780) outputs an enabling signal, Det_En, that triggers (e.g. via either edge or level) the frequency detection circuit (e.g. 120) as described above. The additional RF level detector circuit (750) may be a same as, or similar to, the circuit described in FIG. 4 above, and may be coupled to the RF_IN signal either directly or via a buffer circuit (not shown).

With further reference to FIG. 7, the Det_En signal may be used to ensure that the frequency detection through circuit (120) is enabled only when the RF_IN signal has reached a specific level. For example, if the filter (240) has 10 dB of attenuation at the frequency $f_1$, (per FIG. 3) and 20 dB of attenuation at frequency $f_2$, and if the detector is enabled only when RF_IN reaches 0 dBm, then an output level from the filter (240) of 0 dBm-10 dB=−10 dBm corresponds to the frequency $f_1$, and an output level from the filter (240) of 0 dBm-20 dB=−20 dBm corresponds to the frequency $f_2$. These known RF levels pass through a known transfer function (in units of V/dBm) of the RF Level detector (250) that converts the dBm levels to voltage outputs.

With continued reference to FIG. 7, the additional RF level detector circuit (750) is used to ensure that the amplitude level of the RF_IN signal is at a known level when frequency detection is performed via circuit (120). As mentioned above, the clockless frequency detection according to the present teachings is based on a constant input power level (i.e. amplitude level of the RF_IN signal) to the detection circuit (120). For example, the reference amplitude level provided to the comparator (780) may be set so that the Det_En signal is enabled when the input power level, Pin, is at Pin=0 dBm. In another case where, for example, the tuning circuit comprises an RF PA, the input power may be enabled (e.g via a transceiver unit) at some point, in preparation of a transmission, and may have a finite ramp time before it achieves a final input power level, Pin_final, as shown, for example in FIG. 9 later described. In this case, the reference amplitude level provided to the comparator (780) may be set so that the Det_En signal is enabled when the input power level, Pin, is such that Pin<Pin_final. A person skilled in the art would know of many possible implementations of input power level based triggering circuits that may be used to similarly provide a triggering signal to start the clockless frequency detection circuit (120) according to the present teachings, and therefore, the exemplary implementations described with respect to FIG. 7 should not be considered as limiting such teachings. For example, in an alternative embodiment, level detectors may be used to detect the input amplitude to a filter and a corresponding output amplitude from the filter. By comparing a ratio of the input to output amplitude, an amount of attenuation through the (known) filter, and thus the frequency, can be derived.

As discussed above with reference to FIG. 5, in response to a change of frequency of the RF_IN signal, output of the clockless frequency detection circuit (e.g. 120) may settle according to a non-zero settling time (e.g. $\Delta t_{500}$, $\Delta t_{700}$ of FIG. 5). According to an exemplary embodiment of the present disclosure, in order to read a stable voltage value at the output of the clockless frequency detector circuit (120), a timer circuit may be used to allow the frequency detection to last a predetermined amount of time after detection of a suitable input level of the RF_IN signal (per FIG. 7), and sample a detected voltage value at the output of the clockless frequency detection circuit after expiration of the timer. Such suitable input level may be determined based on an a priori knowledge of a system that generates the RF_IN signal. Such timer circuit (890) and a sampling circuit (895) are shown in FIG. 8.

Figure 8:
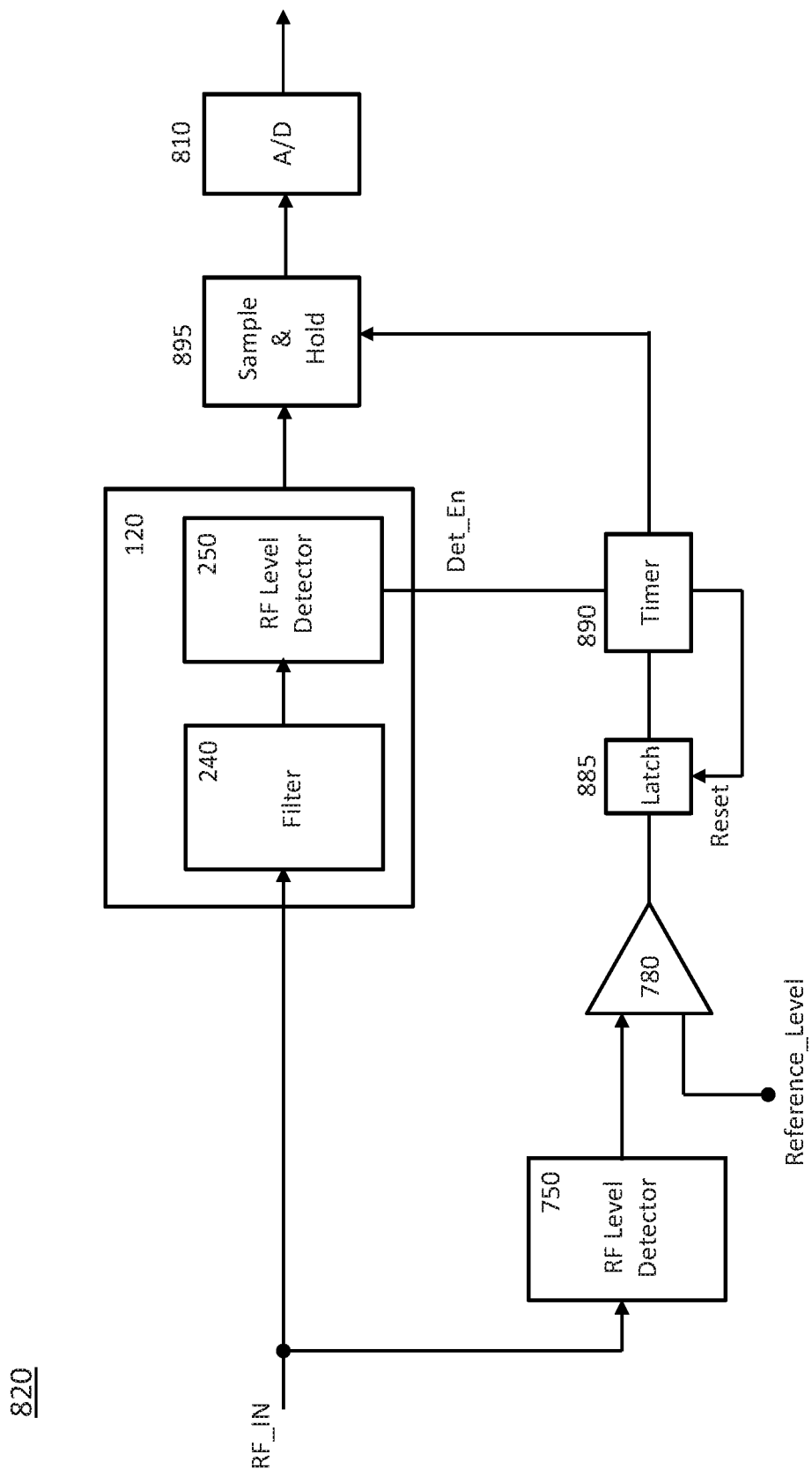
FIG. 8 shows a simplified block diagram of a clockless frequency detector, according to an embodiment of the present disclosure, based on the embodiment depicted in FIG. 7. In the embodiment depicted in FIG. 8, a timer and a latch circuit are used to further qualify an enabling signal that when active, enables frequency detection via the clockless frequency detector. Also, a sample-and-hold circuit and an analog-to-digital circuit are used to digitize an output of the clockless frequency detector circuit.

FIG. 8 shows a clockless frequency detection circuit (820), which is based on the circuit (720) of FIG. 7, where instead of having the comparator (780) directly control the enabling of the frequency detector circuit (120), the comparator (780) may drive a latch (885), and the latch in turn may enable a timer (890). Once enabled, the timer output, Det_En, may change state and thereby enable the frequency detector circuit (120) for a specific amount of time during which such state is maintained. The timer may be programmed to elapse at a time longer than the settling time associated with the frequency detection circuit (120). Once the timer (890) elapses, it may output a triggering signal to a sample-and-hold circuit (895) that samples the (stabilized) output of the frequency detector circuit (120). An analog-to-digital converter (A/D) circuit (810) coupled to an output of the sample-and-hold circuit (895) may be used to measure the value output by the frequency detector circuit (120) sampled upon elapsing of the timer (890). Also, when the timer (890) elapses, the latch (885) may also be reset and thereby put in a ready condition for a next measurement. A digital output of the A/D circuit (810) may then be used to drive the logic circuit (130) of FIG. 1 which translates the detected frequency into appropriate control words for tuning of the tunable elements (115) of the tunable circuit (110). Such translation may be performed according to a variety of implementations known to a person skilled in the art, such as, for example, simple logic gates and/or one or more lookup tables.

It should be noted that tuning according to the present disclosure may be performed by way of control words that when applied to an input control terminal of a tunable element (115) may cause a corresponding change in an operating characteristic of the tunable element (115), thereby providing a tuned frequency dependent performance of the tunable circuit (110). A change in the operating characteristic of any one of the tunable elements (115) may affect any one of measurable performances of the output RF_OUT signal, such as, for example, gain/attenuation, compression point, noise figure, error vector magnitude (EVM), adjacent channel leakage ratio (ACLR), etc. Some example of such tuning may be found in the above referenced U.S. Pat. Nos. 9,024,700 and 9,197,194, the disclosure of which are incorporated herein by reference in their entirety, which respectively describe digitally controllable tunable capacitors and inductors. In another exemplary case, biasing current through an amplifier (e.g. power amplifier) may be advantageously controlled in dependence of a frequency, or a frequency range, of an input RF signal to the amplifier, where a programmable current generator may set according to the detected frequency to provide a desired bias current to the amplifier. A person skilled in the art would know of many different implementations of such programmable current generator, including the non-limiting case of using programmable current mirrors and programmable DC/DC converters.

Tuning according to the present disclosure may also be performed by way of one or more switches that can affect a conduction path of an RF signal through the tunable element (115), as described for example, in the above referenced U.S. Pat. No. 9,602,063 whose disclosure is incorporated herein by reference in its entirety. In this case, under control of the digital output signal, the one or more switches can be turned ON/OFF to route the RF signal through a sequence of specific conduction paths to provide a desired effect to the conducted RF signal through the tunable element (115). Also, as described in U.S. Pat. No. 9,602,063, the one or more switches may be used to switch IN/OUT elements (e.g.

harmonic shorts/open, capacitive, inductive, resistive elements, etc.) within the conduction path of the tunable elements (115).

Figure 9:
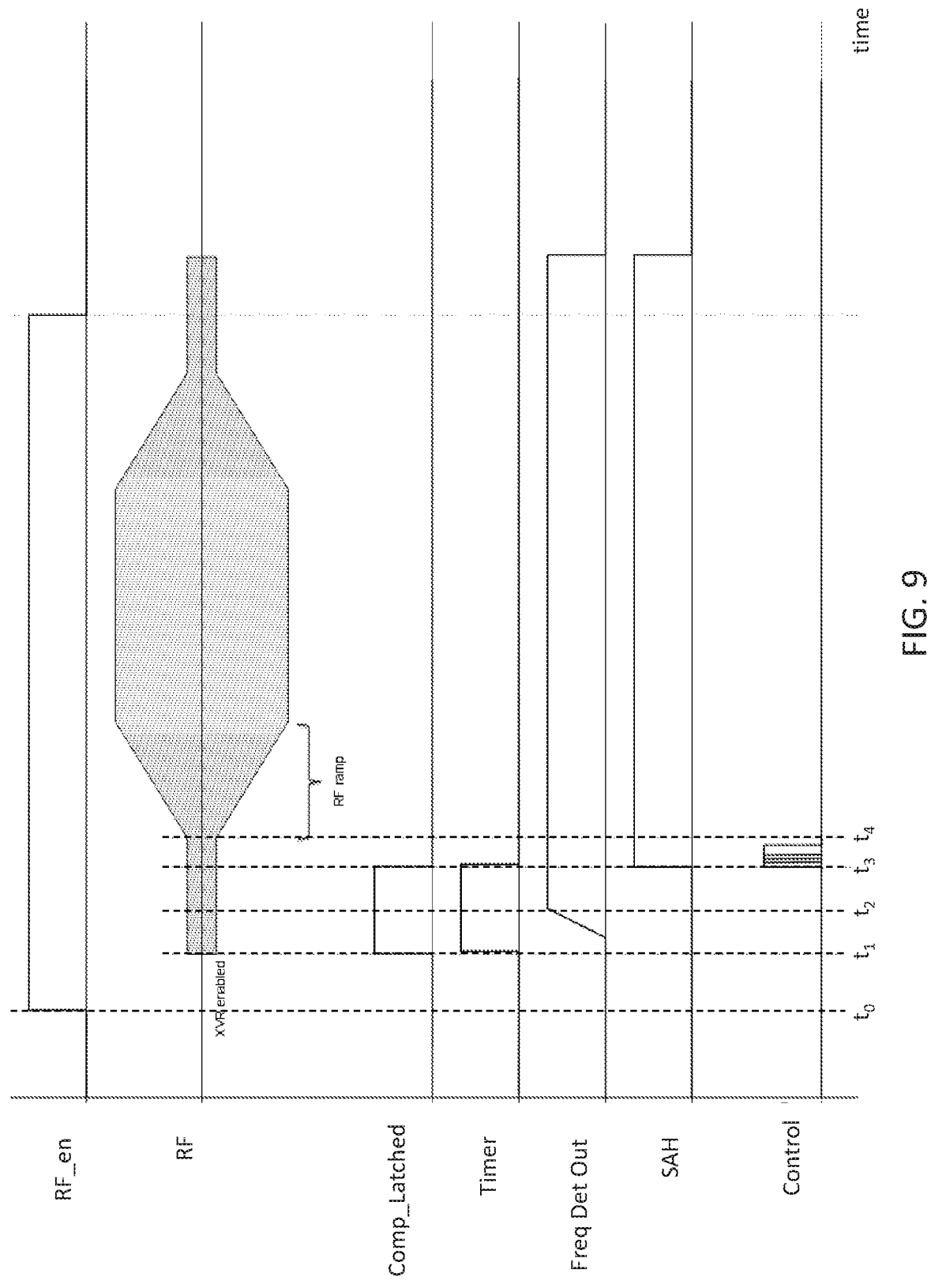
FIG. 9 shows an exemplary timing diagram of the system (100) depicted in FIG. 1, where the frequency detector (120) is provided by the exemplary configuration (820) of FIG. 8.

FIG. 9 shows an exemplary timing diagram of the system (100) depicted in FIG. 1, where the frequency detector (120) is provided by the exemplary configuration (820) of FIG. 8. Here, it is assumed that the tuning circuit (110) is an RF frontend system that includes, for example, a tunable power amplifier and other related tunable circuits that may be used in such frontend system, including, but not limited to, tunable matching circuits, tunable filters, tunable couplers, tunable mixers, tunable biasing circuits, tunable LNA's, and other, as described, for example, in the above referenced Tunable Circuits, the disclosures of which are incorporated herein by reference in their entirety. In turn, such tunable circuits may be tuned via combination of tunable elements (115) such as, DTCs and/or DTLs, DACs, tunable resistors and other tunable elements known to a person skilled in the art, and as described, for example, in the above referenced Tunable Elements, the disclosures of which are incorporated herein by reference in their entirety.

With continued reference to the timing diagram of FIG. 9, at a time t0, an enabling signal, PA_en, is generated by a system controller (e.g. transceiver, not shown) that indicates a beginning cycle of an active communication (e.g. transmission/reception of an RF signal). An RF signal to be transmitted, for example, is generated at time t1, which may have a constant RF amplitude between the time t1 and a time t4, as depicted in FIG. 9. Such behavior is assumed known to the system (100) of FIG. 1 which receives the RF signal at time t1 as its RF_IN, and accordingly sets the reference level to the comparator (780), as the system (100) uses the frequency detection circuit of FIG. 8. The comparator (780) having a reference level smaller than the constant RF amplitude of the incoming RF signal, detects presence of the RF signal and changes state of its output, which is latched by the latch (885), which in turn triggers a start cycle of the timer (890), where the cycle is programmed to be longer than the settling time (e.g. t2–t1) of the frequency detector (120) of FIG. 9. The cycle of the timer (890) elapses at time t3, at which time the sample-and-hold (SAH) circuit (895) samples the output voltage of the frequency detector circuit and the DAC (810) converts the sampled voltage to a digital value which can be provided to the logic circuit (130) of FIG. 1 for generation of corresponding control words (Control) to the tunable circuit (110), and thereby to the tunable elements (115) of the tunable circuit. At the same time t3, the latched comparator output is reset in preparation to a next active communication cycle. As can be seen in FIG. 9, the initial constant portion of the RF amplitude signal lasts from the time t1 to a time t4, after which the RF amplitude ramps up to a desired level. As noted above, such system behavior is a priori known to the system (100) of FIG. 1, and a corresponding programming of the system (100) is performed beforehand (e.g. factory, system integrator, etc.), which may include, for example, setting of the reference voltage to the comparator (890), length of the timer (890) cycle, triggering of the sample-and-hold (895), etc.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A radio frequency (RF) tunable circuit configured to operate over a frequency range of operation of an input RF signal, comprising:

one or more tunable elements;
a filter having at least one frequency response slope in a frequency region that covers the frequency range of operation of the tunable circuit, the at least one frequency response slope determined by one or more poles used to realize the filter; and
a level detector coupled to the filter, and configured to detect an amplitude of the input RF signal through the filter,
wherein tuning of the one or more tunable elements is based on a detected amplitude of the input RF signal through the filter, and is configured to provide a tuned frequency dependent performance of an output RF signal of the tunable circuit, and
wherein a number of the one or more poles of the filter is based on a desired frequency resolution of the tuned frequency dependent performance.

2. A radio frequency (RF) tunable circuit configured to operate over a frequency range of operation of an input RF signal, comprising:
one or more tunable elements;
a filter having at least one frequency response slope in a frequency region that covers the frequency range of operation of the tunable circuit, the at least one frequency response slope determined by one or more poles used to realize the filter;
a level detector coupled to the filter, and configured to detect an amplitude of the input RF signal through the filter; and
an enabling circuit coupled to the level detector, the enabling circuit comprising an additional level detector,
wherein tuning of the one or more tunable elements is based on a detected amplitude of the input RF signal through the filter, and is configured to provide a tuned frequency dependent performance of an output RF signal of the tunable circuit, and
wherein the enabling circuit is configured to provide an enabling signal to the level detector coupled to the filter to enable the detection of the amplitude of the input RF signal through the filter when the enabling signal is active, wherein the enabling signal is active based on a detected level of the input RF signal by the additional level detector of the enabling circuit.

3. The radio frequency (RF) tunable circuit according to claim 1, wherein the enabling circuit is configured to set and maintain the enabling signal active during a time where the input RF signal has a constant amplitude.

4. The radio frequency (RF) tunable circuit according to claim 3,
wherein the enabling circuit further comprises a comparator configured to compare the detected level of the input RF signal by the additional level detector to a reference amplitude that is smaller than the constant amplitude of the input RF signal, and output the enabling signal based on the comparison.

5. The radio frequency (RF) tunable circuit according to claim 4,
wherein the enabling circuit further comprises a latch circuit coupled to an output of the comparator.

6. The radio frequency (RF) tunable circuit according to claim 5,
wherein the enabling circuit further comprises a timer circuit coupled to an output of the latch circuit, configured to activate the enabling signal after a predetermined time based on a settling time of the detected amplitude of the input RF signal through the filter.

7. The radio frequency (RF) tunable circuit according to claim 1, wherein the filter is a low pass filter.

8. The radio frequency (RF) tunable circuit according to claim 1, wherein a number of the one or more poles of the filter is based on a desired frequency resolution of the tuned frequency dependent performance.

9. The radio frequency (RF) tunable circuit according to claim 1, wherein the RF tunable circuit is monolithically integrated as one integrated circuit.

10. The radio frequency (RF) tunable circuit according to claim 1, wherein the RF tunable circuit is part of a frontend system of an RF communication system.

11. The radio frequency (RF) tunable circuit according to claim 1, wherein the RF tunable circuit comprises one or more of: a) a tunable RF amplifier, b) a tunable RF power amplifier, c) a tunable low noise amplifier, d) a tunable filter, e) a tunable match circuit, f) a tunable mixer, g) a tunable coupler, and h) an antenna tuner.

12. The radio frequency (RF) tunable circuit according to claim 1, wherein a tunable element of the one or more tunable elements comprises a tunable conduction path comprising one or more conduction path segments selected via one or more switches.

13. The radio frequency (RF) tunable circuit according to claim 1, wherein a tunable element of the one or more tunable elements comprises one or more switchable elements configured to be selectively switched in and out a conduction path of the tunable element.

14. The radio frequency (RF) tunable circuit according to claim 1, further comprising a logic circuit configured to generate control words for tuning of the one or more tunable elements based on a digitized representation of the detected amplitude of the input RF signal through the filter.

15. The radio frequency (RF) tunable circuit according to claim 14, wherein the logic circuit comprises one or more of: a) an A/D converter, b) a lookup table, and c) logic gates.

16. The radio frequency (RF) tunable circuit according to claim 1, wherein the tuned frequency dependent performance of the output RF signal comprises one or more of: a) a tuned gain, b) a tuned attenuation, c) a tuned compression point, d) a tuned noise figure, e) a tuned error vector magnitude (EVM), and f) a tuned adjacent channel leakage ratio (ACLR).

17. The radio frequency (RF) tunable circuit according to claim 1, wherein the one or more tunable elements comprise one or more of: a) a tunable or programmable reactive element, b) a tunable or programmable capacitor, c) a tunable or programmable inductor, d) a programmable current mirror, e) a programmable DC/DC converter.

18. A method for tuning a radio frequency (RF) tunable circuit, the method comprising:
providing one or more tunable elements of the tunable circuit;
providing a frequency range of operation of an input RF signal to the tunable circuit;
realizing a filter having at least one frequency response slope in a frequency region that covers the frequency range of operation of the tunable circuit, the at least one frequency response slope determined by one or more poles used to realize the filter;
feeding an input RF signal operating at a first frequency of the frequency range to the tunable circuit and the filter;
based on the feeding, detecting via a level detector coupled to the filter, an amplitude of the input RF signal through the filter;

based on the detecting, tuning of the one or more tunable elements; and based on the tuning, providing a tuned frequency dependent performance of an output RF signal of the tunable circuit based on the first frequency, wherein the detecting via the level detector is based on an enabling signal to the level detector to enable detection of the amplitude of the input RF signal through the filter when the enabling signal is active, the enabling signal based on a detected level of the input RF signal detected by an additional level detector of an enabling circuit coupled to the level detector.

19. The method according to claim 18, further comprising:

changing the operating frequency of the input RF signal from the first frequency to a second frequency of the frequency range;

based on the changing, detecting via the level detector, an amplitude of the input RF signal through the filter;

based on the detecting, tuning of the one or more tunable elements; and based on the tuning, providing a tuned frequency dependent performance of the output RF signal of the tunable circuit based on the second frequency.

* * * * *